(12) United States Patent
Lee et al.

(10) Patent No.: US 10,707,393 B2
(45) Date of Patent: Jul. 7, 2020

(54) LIGHT EMITTING DEVICE PACKAGE INCLUDING LIGHT EMITTING DEVICES, LIGHT-TRANSMISSIVE SUBSTRATE, AND EUTECTIC BONDING LAYER INTERPOSED THEREBETWEEN AND DISPLAY DEVICE USING THE SAME

(71) Applicant: Samsung Electronics Co., Ltd., Suwon-si, Gyeonggi-do (KR)

(72) Inventors: Dong Gun Lee, Hwaseong-si (KR); Yong Il Kim, Seoul (KR); Han Kyu Seong, Seoul (KR); Ji Hye Yeon, Suwon-si (KR); Jin Sub Lee, Suwon-si (KR); Young Jin Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 14 days.

(21) Appl. No.: 15/995,546

(22) Filed: Jun. 1, 2018

(65) Prior Publication Data

US 2019/0189876 A1  Jun. 20, 2019

(30) Foreign Application Priority Data

Dec. 14, 2017  (KR) .................... 10-2017-0171926

(51) Int. Cl.
*H01L 33/00* (2010.01)
*H01L 33/62* (2010.01)
(Continued)

(52) U.S. Cl.
CPC .......... *H01L 33/62* (2013.01); *H01L 25/0753* (2013.01); *H01L 33/44* (2013.01);
(Continued)

(58) Field of Classification Search
CPC .... H01L 33/62; H01L 25/0753; H01L 33/507
(Continued)

(56) References Cited

U.S. PATENT DOCUMENTS 6,372,608 B1  4/2002  Shimoda et al.
6,645,830 B2  11/2003  Shimoda et al.
(Continued)

FOREIGN PATENT DOCUMENTS

| KR | 10-2017-0096127 A | 8/2017 |
| KR | 10-2017-0099650 A | 9/2017 |
| KR | 10-2018-0076066 | 7/2018 |

*Primary Examiner* — Caleb E Henry
(74) *Attorney, Agent, or Firm* — Harness, Dickey & Pierce, P.L.C.

(57) ABSTRACT

A light emitting device package including a cell array including first, second and third light emitting devices each including a first conductivity-type semiconductor layer, an active layer, and a second conductivity-type semiconductor layer, the cell array having a first surface and a second surface opposing the first surface, a light-transmissive substrate including a first wavelength conversion portion and a second wavelength conversion portion corresponding to the first light emitting device and the second light emitting device, respectively, and bonded to the first surface, and a eutectic bonding layer including a first light emitting window, a second light emitting window and a third light emitting window corresponding to the first light emitting device, the second light emitting device and the third light emitting device, respectively, and bonding the light-transmissive substrate and the first to third light emitting devices to each other may be provided.

18 Claims, 11 Drawing Sheets

(51) Int. Cl.
*H01L 33/44* (2010.01)
*H01L 33/60* (2010.01)
*H01L 25/075* (2006.01)
*H01L 33/50* (2010.01)
*H01L 27/15* (2006.01)
*H01L 33/46* (2010.01)

(52) U.S. Cl.
CPC ............ *H01L 33/507* (2013.01); *H01L 33/60* (2013.01); *H01L 27/153* (2013.01); *H01L 33/46* (2013.01); *H01L 33/502* (2013.01); *H01L 33/504* (2013.01); *H01L 33/505* (2013.01); *H01L 2933/0033* (2013.01)

(58) Field of Classification Search
USPC .......................................................... 257/98
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,004,171 B2 | 8/2011 | Yamashita et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,129,905 B2 | 3/2012 | Okuyama et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,112,183 B2 | 8/2015 | Ohta | |
| 9,123,868 B2* | 9/2015 | Pan | H01L 25/0753 |
| 9,257,416 B2 | 2/2016 | Akimoto et al. | |
| 9,893,251 B2 | 2/2018 | Kim et al. | |
| 2003/0019568 A1* | 1/2003 | Liu | B32B 7/12 156/245 |
| 2006/0283917 A1* | 12/2006 | Jin | B23K 1/0016 228/112.1 |
| 2007/0241681 A1 | 10/2007 | Yoo et al. | |
| 2012/0042515 A1* | 2/2012 | Shoji | H05K 3/3436 29/841 |
| 2013/0134383 A1* | 5/2013 | Hwang | H01L 45/16 257/5 |
| 2014/0367633 A1* | 12/2014 | Bibl | G02F 1/133603 257/13 |
| 2016/0043276 A1* | 2/2016 | Im | H01L 33/18 257/13 |
| 2017/0279008 A1* | 9/2017 | You | H01L 33/20 |
| 2017/0373046 A1 | 12/2017 | Gardner et al. | |
| 2018/0182931 A1 | 6/2018 | Lee et al. | |
| 2019/0229097 A1* | 7/2019 | Takeya | H01L 25/167 |

\* cited by examiner

US 10,707,393 B2

LIGHT EMITTING DEVICE PACKAGE INCLUDING LIGHT EMITTING DEVICES, LIGHT-TRANSMISSIVE SUBSTRATE, AND EUTECTIC BONDING LAYER INTERPOSED THEREBETWEEN AND DISPLAY DEVICE USING THE SAME

CROSS-REFERENCE TO RELATED APPLICATION(S)

This application claims priority under 35 U.S.C. § 119 to Korean Patent Application No. 10-2017-0171926 filed on Dec. 14, 2017, with in the Korean Intellectual Property Office, the disclosure of which is incorporated herein by reference in its entirety.

BACKGROUND

1. Field

The present inventive concepts relate to light emitting device packages, and/or display devices using the same.

2. Description of Related Art

Light emitting devices such as semiconductor light emitting diode (LED) devices have been used as light sources in various electronic products, as well as light sources for lighting devices. In particular, light emitting devices are widely used as light sources in various types of display devices such as televisions, mobile phones, personal computers (PCs), laptop PCs, and personal digital assistants (PDAs).

Conventional display devices include display panels, such as liquid crystal display (LCD) panels and backlight units. In recent years, display devices which do not use backlight units (e.g., a display device using an LED device as a single pixel) are being researched and developed. Such display devices may have a compact size, and may be implemented as high brightness displays having improved optical efficiency, compared to conventional LCD-based display devices. Such display devices may allow an aspect ratio of a display image to be freely changed, and may be implemented as large display devices, thereby providing various forms of large displays.

SUMMARY

An aspect of the present inventive concepts are to provide light emitting device packages and/or display devices with reduced manufacturing cost and ease of miniaturization.

According to an aspect of the present inventive concepts, a light emitting device package includes a cell array including a first light emitting device, a second light emitting device, and a third light emitting device, each of the first, second and third light emitting devices including a first conductivity-type semiconductor layer, an active layer, and a second conductivity-type semiconductor layer, the cell array having a first surface and a second surface opposing the first surface, a light-transmissive substrate including a first wavelength conversion portion and a second wavelength conversion portion corresponding to the first light emitting device and the second light emitting device, respectively, the light-transmissive substrate bonded to the first surface, and a eutectic bonding layer including a first light emitting window, a second light emitting window and a third light emitting window corresponding to the first light emitting device, the second light emitting device and the third light emitting device, respectively, the eutectic bonding layer bonding the light-transmissive substrate and the first to third light emitting devices to each other.

According to an aspect of the present inventive concepts, a light emitting device package includes a light-transmissive substrate including a first region and a second region, the first region including at least one wavelength conversion portion, a cell array bonded to the light-transmissive substrate, the cell array including a first light emitting device, a second light emitting device and a third light emitting device, each of the first to third light emitting devices including a first conductivity-type semiconductor layer, an active layer and a second conductivity-type semiconductor layer, the first light emitting device and the second light emitting device overlapping the first region, the third light emitting device overlapping the second region, and a eutectic bonding layer including a plurality of light emitting windows corresponding to the first light emitting device, the second light emitting device and the third light emitting device, respectively, the eutectic bonding layer bonding the light-transmissive substrate and the cell array to each other.

According to an aspect of the present inventive concepts, a display device may include a display panel including a circuit board and a plurality of light emitting device packages arranged in rows and columns on the circuit board, each of the plurality of light emitting device packages providing a single pixel, a driver configured to drive the display panel, and a controller configured to control the driver. The display panel may include a cell array including a first light emitting device, a second light emitting device, and a third light emitting device, each of the first, second, and third light emitting devices including a first conductivity-type semiconductor layer, an active layer and a second conductivity-type semiconductor layer, the cell array having a first surface and a second surface opposing the first surface, a light-transmissive substrate including a first wavelength conversion portion and a second wavelength conversion portion corresponding to the first light emitting device and the second light emitting device, respectively, the light-transmissive substrate bonded to the first surface, and a eutectic bonding layer including a first light emitting window, a second light emitting window and a third light emitting window corresponding to the first light emitting device, the second light emitting device and the third light emitting device, respectively, the eutectic bonding layer bonding the light-transmissive substrate and the first to third light emitting devices to each other.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, some example embodiments of the present inventive concepts will be described in detail with reference to the accompanying drawings.

Figure 1:
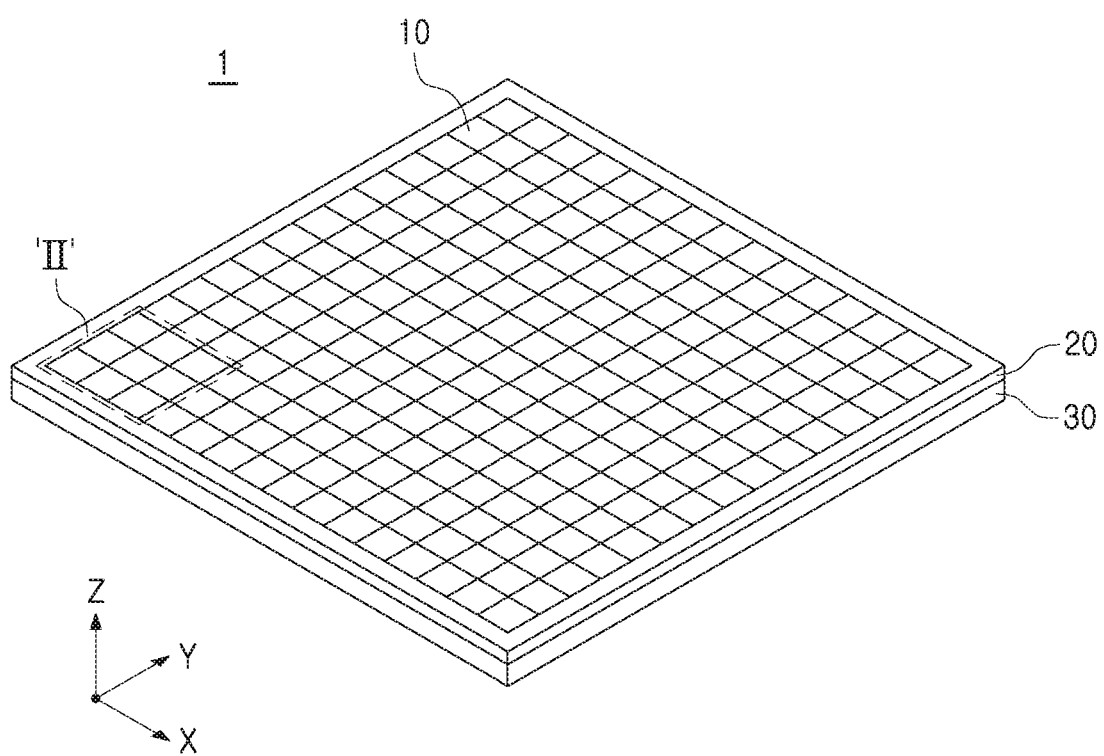
FIG. 1 is a schematic perspective view of a display device including a light emitting device package according to an example embodiment of the present inventive concepts.
Figure 2:
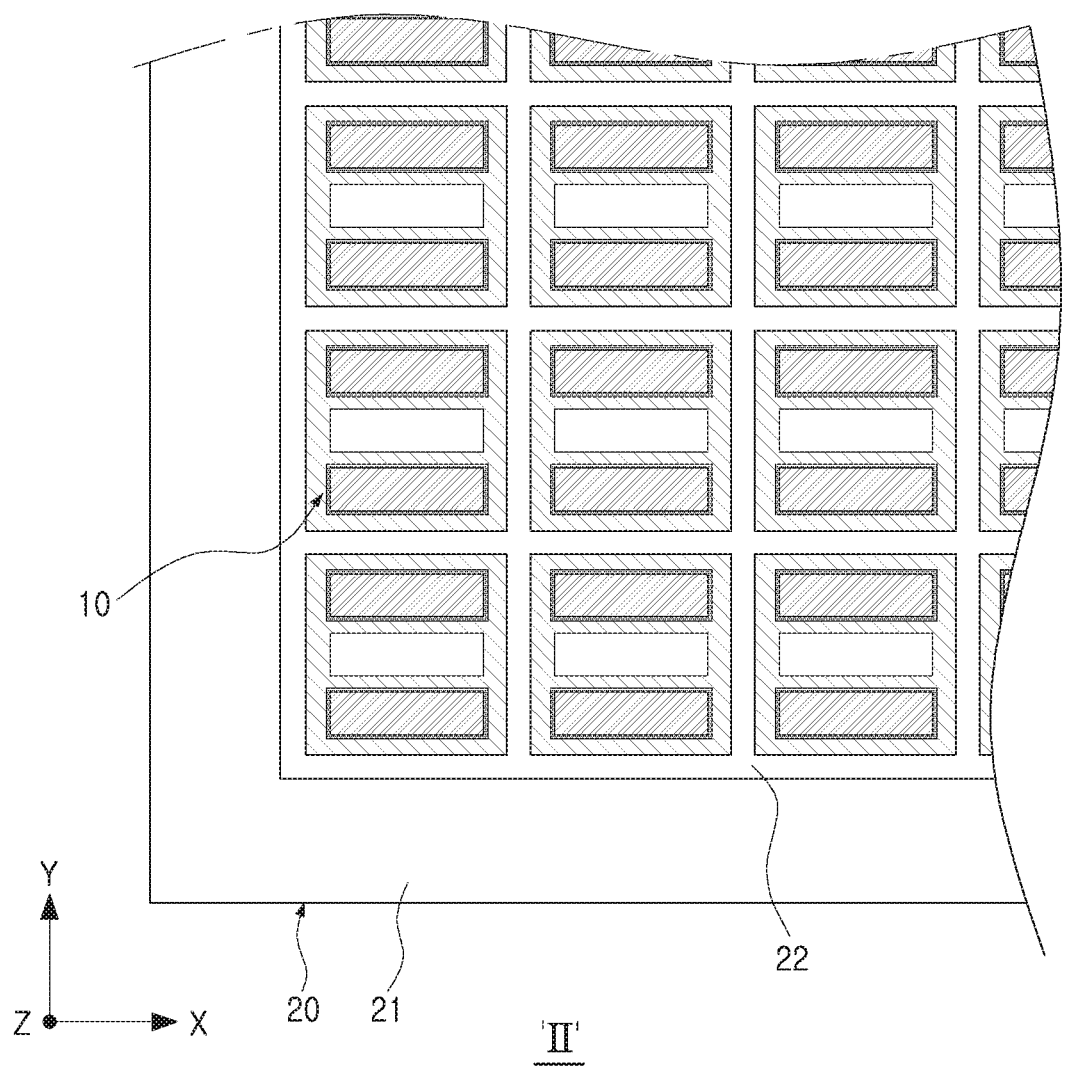
FIG. 2 is an enlarged plan view of portion 'II' of FIG. 1.

FIG. 1 is a schematic perspective view of a display device including a light emitting device package according to an example embodiment, and FIG. 2 is an enlarged plan view of portion 'A' of FIG. 1.

Referring to FIG. 1, a display device 1 may include a circuit board 30 and a display panel 20 arranged on the circuit board 30.

The display panel 20 according to the example embodiment may include a plurality of light emitting device packages 10 capable of emitting mixed red (R), green (G) and blue (B) light. Each of the plurality of light emitting device packages 10 may constitute a single pixel of the display panel, and may be arranged in rows and columns on the circuit board 30. In this example embodiment, although a configuration in which the light emitting device packages 10 of 15×15 are arranged is illustrated for convenience of description, example embodiments are not limited thereto. According to some example embodiments, larger number of light emitting device packages, for example, 1024×768 or 1920×1080 light emitting device packages, may be arranged, depending on a desired resolution.

Each of the light emitting device packages 10 may include a plurality of subpixels corresponding to RGB light sources, and the plurality of subpixels in one light emitting device package 10 may be adjacent to each other, which will be described in detail with reference to FIGS. 3 to 6. A subpixel color is not limited to RGB, and various colors such as cyan, yellow, magenta and black (CYMK) may also be used. Although the example embodiment illustrates that three subpixels corresponding to RGB light sources, respectively, are included in a single pixel, example embodiments are not limited thereto. In some example embodiments, four or more subpixels may be included in a single pixel.

On the circuit board 30, a driving unit configured to supply power to respective light emitting device packages 10 of the display panel 20, and a controller controlling the driving unit, may be disposed. The circuit board 30 may include a circuit configured to independently drive subpixels of respective pixels. For example, the circuit board 30 may be a thin film transistor (TFT) substrate including a thin film transistor (TFT).

Referring to FIG. 2, the display panel 20 may further include a first partition structure 21 defining a region in which the plurality of light emitting device packages 10 are disposed. Further, each of the plurality of light emitting device packages 10 may be surrounded by a second partition structure 22. The second partition structure 22 may electrically isolate respective light emitting device packages 10, such that each light emitting device package 10 may be independently driven as a single pixel. Further, the second partition structure 22 may firmly fix the plurality of light emitting device packages 10 on the circuit board 30. In some example embodiments, the first and second partition structures 21 and 22 may not be provided.

The first and second partition structures 21 and 22 may include a black matrix. For example, the black matrix may be around the circuit board, and serve as a guide line for defining mounting regions of the plurality of light emitting device packages 10. Example embodiments are the black matrix. In some example embodiments, the first and second partition structures 21 and 22 may include a white matrix, a green matrix, or the like, depending on, for example, usage and location of product. A transparent matrix may also be used as desired. The white matrix may further include a reflective material or a light scattering material. The black matrix may include at least one of materials including a ceramic, a semiconductor, a metal, or a polymer including a resin.

Figure 3:
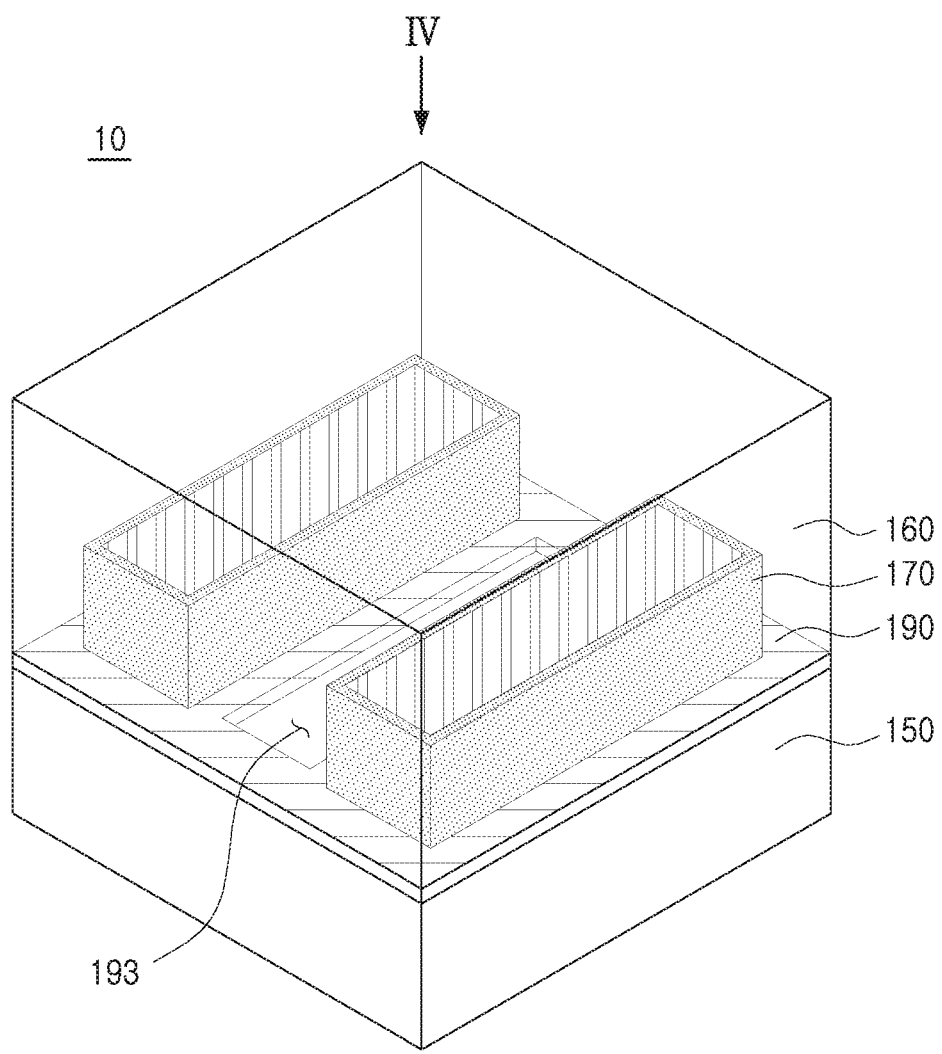
FIG. 3 is a schematic perspective view of the light emitting device package of FIG. 2.
Figure 4:
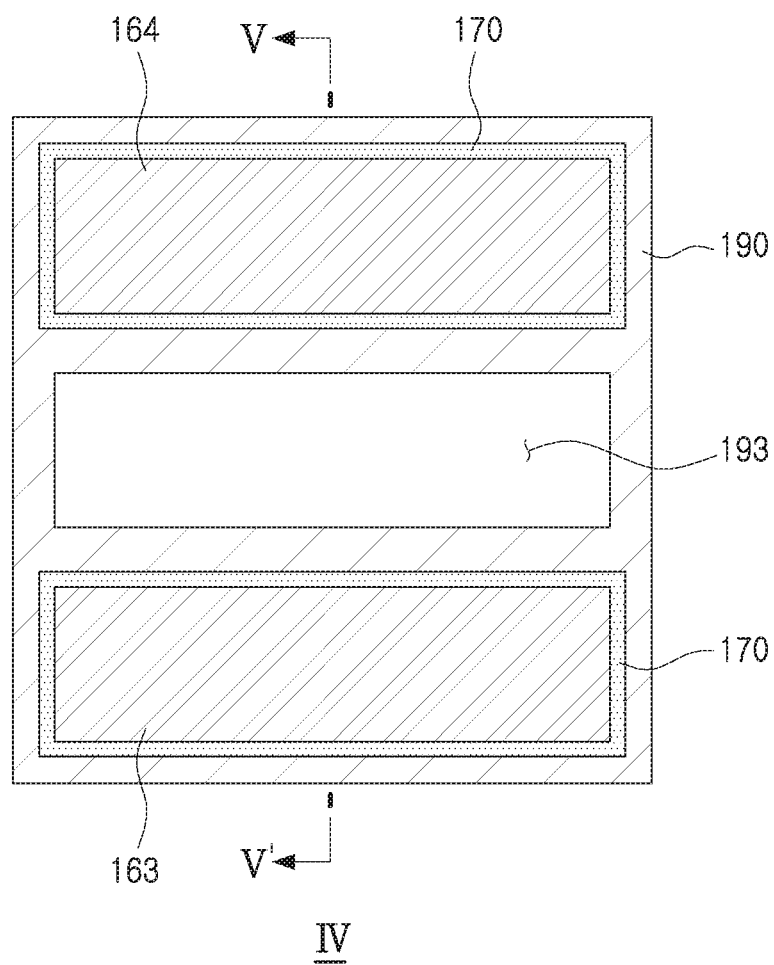
FIG. 4 is a plan view of the light emitting device package viewed in a 'IV' direction in FIG. 3.
Figure 5:
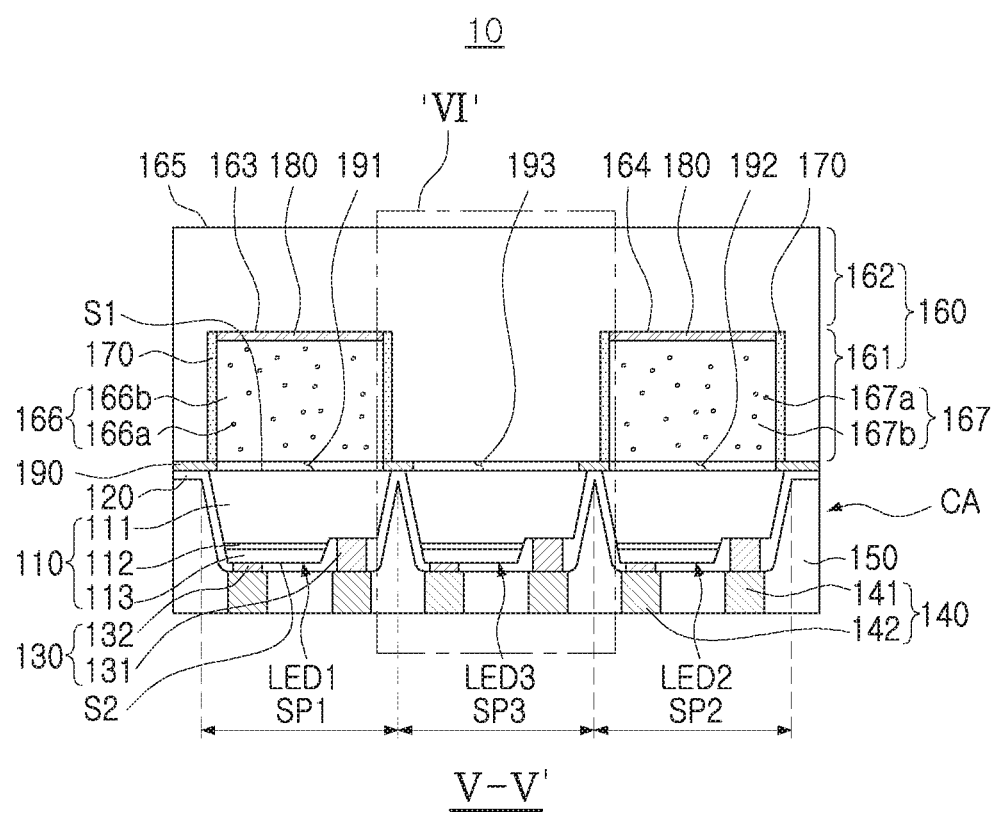
FIG. 5 is a side cross-sectional view taken along line V-V' of FIG. 4.
Figure 6:
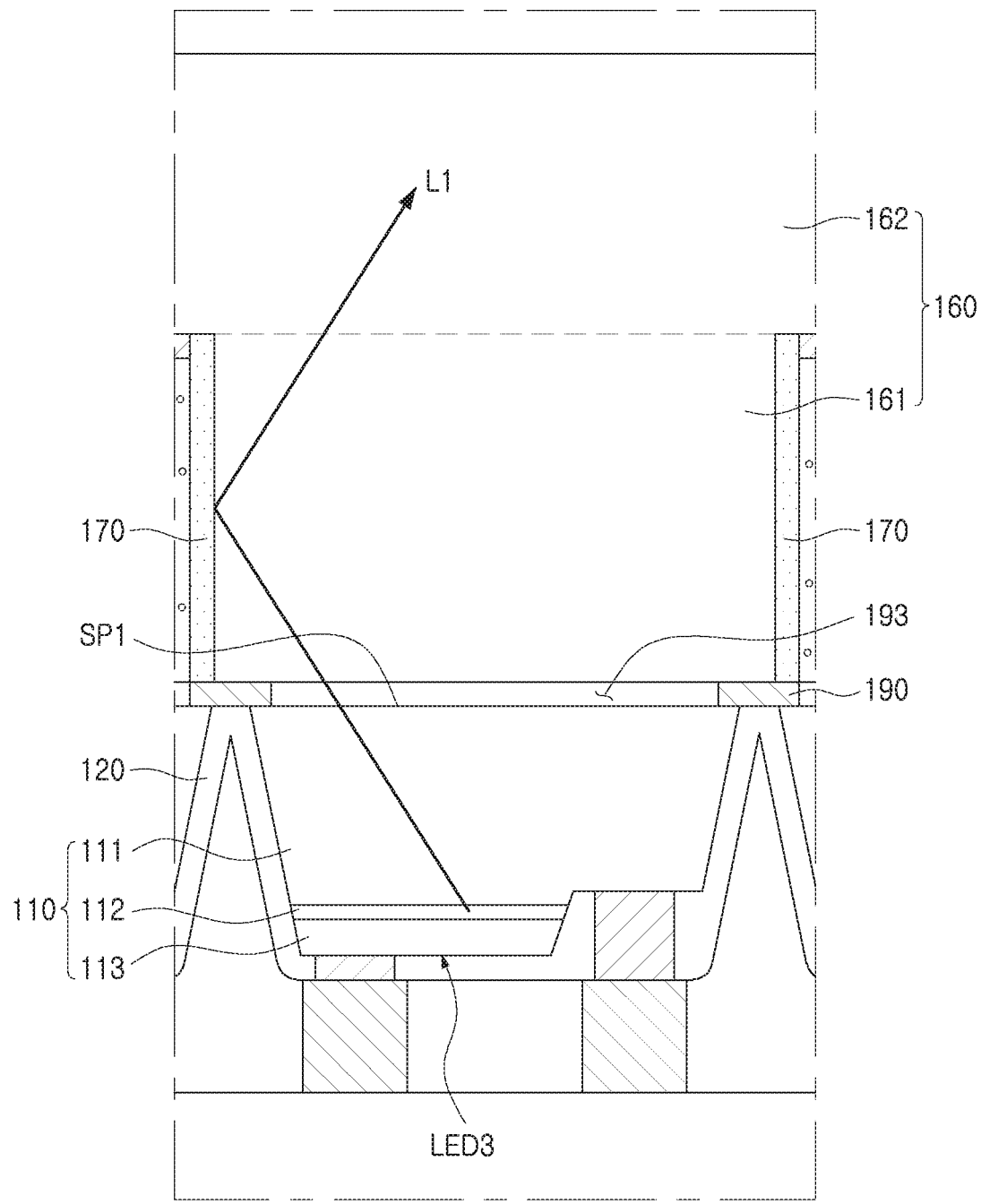
FIG. 6 is an enlarged view of portion 'VI' of FIG. 5.

FIG. 3 is a schematic perspective view of the light emitting device package of FIG. 2, and FIG. 4 is a plan view of the light emitting device package, viewed in a direction IV of FIG. 3. FIG. 5 is a cross-sectional view taken along line V-V' of FIG. 4, and FIG. 6 is an enlarged view of portion 'IV' of FIG. 5.

Referring to FIGS. 3 to 5, the light emitting device package 10 forming a single pixel may include a cell array CA including first to third light emitting devices LED1, LED2 and LED3, a light-transmissive substrate 160 including a wavelength conversion portion, and a eutectic bonding layer 190 bonding the cell array CA and the light-transmissive substrate 160 to each other. The light emitting device package 10 according to an example embodiment may be a chip scale package (CSP) or may be a wafer level package (WLP).

The light emitting device package 10 may include first, second and third subpixels SP1, SP2 and SP3, corresponding to RGB light sources of a single pixel, respectively. The first and second subpixels SP1 and SP2 may include first and second light emitting devices LED1 and LED2, and first and second wavelength conversion portions 166 and 167, respectively, and the third subpixel SP3 may only include a third light emitting device LED3 without a wavelength conversion portion. Thus, light rays emitted from the first and second light emitting devices LED1 and LED2 may be converted into light rays having different wavelengths through the first and second wavelength conversion portions, respectively, to then be emitted, and light emitted from the third light emitting device LED3 may be emitted without wavelength conversion.

The first, second and third light emitting devices LED1, LED2 and LED3 may be arranged to be parallel to each other, while being adjacent to each other, and the third light emitting device LED3 may be disposed between the first light emitting device LED1 and the second light emitting device LED2. In this case, the first, second and third light emitting devices LED1, LED2 and LED3 may be adjacent to each other within a range not electrically affecting or interfering with each other. In some example embodiments, the first, second and third light emitting devices LED1 to LED3 may have an interval sufficient to maintain electrical insulation therebetween by an insulating layer 120 to be described later provided therebetween.

The cell array CA may include the first to third light emitting devices LED1, LED2 and LED3, each including a first conductivity-type semiconductor layer 111, an active layer 112, and a second conductivity-type semiconductor layer 113, and may have a first surface S1 and a second surface S2 opposing the first surface S1.

The first to third light emitting devices LED1, LED2 and LED3 may include a light emitting structure 110 in which epitaxial layers, such as a first conductivity-type semiconductor layer 111, an active layer 112 and a second conductivity-type semiconductor layer 113, are stacked, as illustrated in FIGS. 5 and 6. The epitaxial layers may be grown by the same process in a single wafer. The active layers 112 of the first to third light emitting devices LED1, LED2 and LED3 may be configured to emit the same light. For example, the active layer 112 may emit blue light of, for example, 440 nm to 460 nm. The first to third light emitting devices LED1, LED2 and LED3 may have the same structure, and mainly the first light emitting device LED1 will be described to avoid duplication of descriptions.

The first conductivity-type semiconductor layer 111 may provide a first surface S1 of the cell array CA, and the second conductivity-type semiconductor layer 113 may provide a second surface S2 of the cell array CA. The first conductivity-type semiconductor layer 111 and the second conductivity-type semiconductor layer 113 may be provided as an n-type semiconductor layer and a p-type semiconductor layer, respectively. For example, the first conductivity-type semiconductor layer 111 and the second conductivity-type semiconductor layer 113 may be provided as a nitride semiconductor of $Al_xIn_yGa_{(1-x-y)}N (0 \le x \le 1, 0 \le y \le 1, 0 \le x+y \le 1)$. The active layer 112 may have a multiple quantum well (MQW) structure in which a quantum well layer and a quantum barrier layer are alternately stacked. For example, the active layer 112 may have a nitride-based MQW structure (e.g., InGaN or GaN/AlGaN). However, example embodiments are not limited thereto. In some example embodiments, the active layer 112 may be a different semiconductor such as GaAs/AlGaAs, InGaP/GaP, or GaP/AlGaP. According to an example embodiment, an uneven pattern may be formed on the first surface S1 of the cell array CA, and thus light extraction efficiency may be further improved. The uneven pattern may be obtained by, for example, wet-etching an exposed surface of the first conductivity-type semiconductor layer 111 or by dry-etching the exposed surface of the first conductivity-type semiconductor layer 111 using plasma.

The cell array CA may include an insulating layer 120 disposed on the second surface to surround the respective first, second, and third light emitting devices LED1, LED2 and LED3. The insulating layer 120 may electrically isolate the first, second, and third light emitting devices LED1, LED2 and LED3 from one another.

As illustrated in FIG. 6, the insulating layer 120 may be in contact with the eutectic bonding layer 190, to mitigate or prevent the occurrence of a so-called, light leakage phenomenon among the first to third subpixels SP1, SP2 and SP3. For example, light L1 emitted by the third light emitting device LED3 may be optically shielded from interfering with light emitted by the first and second light emitting devices LED1 and LED2.

The insulating layer 120 may be formed of an electrical insulating material. For example, the insulating layer 120 may be formed of a silicon oxide, a silicon oxynitride, or a silicon nitride. In some example embodiments, the insulating layer 120 may further include a material having a relatively low light absorption rate or reflective properties, or a material having a reflective structure. The insulating layer 120 may mitigate or prevent mutual optical interference between the first to third light emitting devices LED1, LED2 and LED3 to secure independent driving of the first to third light emitting devices LED1, LED2 and LED3. In some example embodiments, the insulating layer 120 may include a distributed Bragg reflector (DBR) structure in which a plurality of insulating films having different refractive indices are alternately stacked. In such a DBR structure, a plurality of insulating films having different refractive indexes may be repeatedly stacked two to 100 times. A material of the plurality of insulating films may be selected from oxides or nitrides (e.g., $SiO_2$, SiN, $SiO_xN_y$, $TiO_2$, $Si_3N_4$, $Al_2O_3$, $ZrO_2$, TiN, AlN, TiAlN, and/or TiSiN).

Each of the first to third light emitting devices LED1, LED2 and LED3 may include an electrode portion 130 for applying power to a first conductivity-type semiconductor layer 111 and a second conductivity-type semiconductor layer 113. The electrode portion 130 may include first and second electrodes 131 and 132. The first and second electrodes 131 and 132 may be disposed in a mesa-etched region of the first conductivity-type semiconductor layer 111 and the second conductivity-type semiconductor layer 113, respectively. For example, the first electrode 131 may include at least one of aluminum (Al), gold (Au), chromium (Cr), nickel (Ni), titanium (Ti), and stannum (Sn), and the second electrode 132 may include a reflective metal. For example, the second electrode 132 may include a material such as silver (Ag), Ni, Al, Cr, rhodium (Rh), palladium (Pd), iridium (Jr), ruthenium (Ru), magnesium (Mg), zinc (Zn), platinum (Pt), or Au, and may be a single layer or two or more layer structure.

Each of the first to third light emitting devices LED1, LED2 and LED3 may include an electrode pad part 140 applying power to the light emitting device package 10. The electrode pad part 140 may include first and second electrode pads 141 and 142. The first and second electrode pads 141 and 142 may be connected to the first and second electrodes 131 and 132, respectively.

The light emitting device package 10 may include a molding part 150 exposing the electrode pad part 140 while covering a lower surface of the cell array CA. The molding part 150 may have a relatively high Young's modulus to firmly support the light emitting device package 10. The molding part 150 may include a material having relatively high thermal conductivity to effectively dissipate heat generated from the first to third light emitting devices LEL1, LED2 and LED3. For example, the molding part 150 may include an epoxy resin or a silicone resin. In some example embodiments, the molding part 150 may include light reflective particles to reflect light. The light-reflective particles may include titanium dioxide ($TiO_2$) or aluminum oxide ($Al_2O_3$) particles may be used. However, the light-reflective particles according to example embodiments are not limited thereto.

The first to third light emitting devices LED1, LED2 and LED3 may be arranged to have the same area when viewed in a 'IV' direction. However, areas of the first to third light emitting devices LED1, LED2 and LED3 according to example embodiments are not limited thereto. In some example embodiments, the first to third light emitting devices LED1, LED2 and LED3 may be arranged to have different areas.

The light-transmissive substrate 160 may be bonded to the first surface S1 of the cell array CA to support the cell array CA, and may provide a wavelength conversion portion for converting light emitted by the first and second light emitting devices LED1 and LED2 of the cell array CA.

The light-transmissive substrate 160 may include first and second recesses 163 and 164 in which the wavelength conversion portion is filled, a support portion 161 disposed between the first and second recesses 163 and 164, and a flat portion 162 disposed on the first and second recesses 163 and 164 and the support portion 161.

The supporting portion 161 may be disposed to fill a space between the first and second recesses 163 and 164, to provide rigidity by which the light-transmissive substrate 160 may firmly support the cell array CA. The support portion 161 may be disposed on the third light emitting device LED3, to transmit light emitted by the third light emitting device LED3 to the flat portion 162 provided on the support portion 161.

The flat portion 162 may be located on upper portions of the first and second recesses 163 and 164 and the support portion 161, in a manner of extending to the support portion 161. The flat portion 162 may encapsulate the first and second recesses 163 and 164, and may be used as a light waveguide for transmitting light emitted by the first and second recesses 163 and 164 and the support portion 161, respectively.

The light-transmissive substrate 160 may be formed of a transparent material. As the material of the light-transmissive substrate 160, any material having a degree of hardness sufficient to firmly support the cell array CA in a process of separating the cell array CA from a support substrate may be used. For example, the light-transmissive substrate 160 may include a light-transmitting insulating material (e.g., at least one of glass, quartz, a transparent resin, $SiO_2$, $SiN_x$, $Al_2O_3$, HfO, $TiO_2$ or ZrO). For example, in the case where the light-transmissive substrate 160 is formed of glass, the glass may be Pyrex® or Zerodur®, which has a relatively high melting point, may be used. The light-transmissive substrate 160 may be formed by cutting a wafer-shaped mother substrate having one surface and the other surface opposing the one surface.

In the light-transmissive substrate 160, the first and second wavelength conversion portions 166 and 167 may be disposed in positions thereof corresponding to locations of the first and second light emitting devices LED1 and LED2. The first and second wavelength conversion portions 166 and 167 may be exposed on surfaces thereof contacting the first and second light emitting devices LED1 and LED2, but example embodiments thereof is not limited thereto. In some example embodiments, the first and second wavelength conversion portions 166 and 167 may be disposed in the inside of the light-transmissive substrate 160.

The first and second wavelength conversion portions 166 and 167 may be formed by forming first and second recesses 163 and 164 in one surface of the light-transmissive substrate 160 and filling the first and second recesses 163 and 164 with a wavelength converting material.

The first and second recesses 163 and 164 may be formed to have a predetermined (or alternatively, desired) depth at positions corresponding to locations of the first and second light emitting devices LED1 and LED2, respectively. The first and second recesses 163 and 164 may be modified to have various shapes. For example, as illustrated in FIGS. 3 to 5, the first and second recesses 163 and 164 may be formed to each have a quadrangular columnar space when viewed in the 'IV' direction. The first and second recesses 163 and 164 may have the same depth, or may have different depths depending on example embodiments.

The wavelength converting material filled in the first and second recesses 163 and 164 may be a material in which a material such as at least one type of phosphor or quantum dot (QD) is dispersed in a resin such as silicone. Further, the wavelength converting material may be a material in which the phosphor or quantum dot is dispersed in a material having the same composition as that of the light-transmissive substrate 160, or may be a mixture of materials having the same composition as that of the light-transmissive substrate 160. In an example embodiment, the first and second recesses 163 and 164 may include a phosphor or a quantum dot capable of performing wavelength conversion of blue light into red light and green light.

The first and second wavelength conversion portions 166 and 167 may be formed by filling the first and second recesses 163 and 164 with the wavelength converting material and then curing the wavelength converting material. For example, the first and second wavelength conversion portions 166 and 167 may be formed by dispensing or inkjet-printing, light-transmissive liquid resins 166b and 167b mixed with red phosphors 166a and green phosphors 167a, in the first and second recesses 163 and 164, and then curing the dispensed or inkjet-printed light-transmissive liquid resins.

An optical filter layer 180 or a distributed Bragg reflector (DBR) may be further disposed on respective upper surfaces of the first and second wavelength conversion portions 166 and 167, to selectively block light of a specific wavelength, as desired. In an example embodiment, light of a specific wavelength may be blue light emitted by the first and second light emitting devices LED1 and LED2, and the optical filter layer 180 and the distributed Bragg reflector may be provided to selectively block blue light. Thus, by using the optical filter layer 180 or the distributed Bragg reflector, the first and second subpixels SP1 and SP2 may provide light from which blue light has been removed.

As illustrated in FIG. 5, a reflective layer 170 may respectively be disposed on each of lateral surfaces of the first and second recesses 163 and 164, to reflect light emitted by the first and second light emitting devices LED1 and LED2. The reflective layer 170 may cover the entirety of the lateral surfaces of the first and second recesses 163 and 164, and may be in contact with the eutectic bonding layer 190 to mitigate or prevent light leakage from occurring among the first to third subpixels SP1, SP2 and SP3. For example, light emitted by the first and second light emitting devices LED1 and LED2 may be optically shielded from interfering with each other. The reflective layer 170 may reflect light emitted by the first to third light emitting devices LED1, LED2 and LED3 to focus the light toward the front of the light emitting device package 10 in the 'IV' direction (see FIG. 3). The reflective layer may include a relatively high reflectivity metal (e.g., at least one of aluminum (Al), ruthenium (Ru), rhodium (Rh), gold (Au), silver (Ag), platinum (Pt), nickel (Ni), chromium (Cr), titanium (Ti), or copper (Cu)).

Further, as illustrated in FIG. 6, the reflective layer 170 may reflect light L1 emitted by the third light emitting device LED3 of the third subpixel SP3, to focus the light on the front of the light emitting device package 10 in the 'IV' direction of (see FIG. 3).

Because light emitted by the first to third light emitting devices LED1, LED2 and LED3 may be transmitted through the light-transmissive substrate 160 due to light transmitting properties of the light-transmissive substrate 160, the light-transmissive substrate 160 may serve as a protective layer encapsulating the first and second wavelength conversion portions 166 and 167. Further, because the light-transmissive substrate 160 is bonded to the light emitting structure 110, an improved moisture-resistance effect may be expected.

The light-transmissive substrate 160 may be chosen to have hardness sufficient to firmly support the cell array CA in a process of separating a temporary substrate attached to the cell array CA. In such a case, the light-transmissive substrate 160 may be used as a support substrate for separating the temporary substrate. Thus, a separate support to mitigate or prevent damage to the cell array CA in the process of removing the temporary substrate may not be desired, and thus a manufacturing process may be simplified.

Further, the light-transmissive substrate 160 may be finely polished and/or thinned by chemical mechanical polishing (CMP) in a direction of the other surface opposing the surface of the light-transmissive substrate 160 bonded to the light emitting structure 110. However, example embodiments are not limited thereto. In some example embodiments, the other surface of the light-transmissive substrate 160 may be partially chemically etched. In the case that the light-transmissive substrate 160 is sufficiently thin, the thinning process may be omitted. In the thinning process, a thickness of the light-transmissive substrate 160 may be reduced, thereby improving light extraction efficiency, and/or reducing damage of the light-transmissive substrate 160 occurring in a subsequent process for separating individual semiconductor light emitting device packages 100.

Further, according to an example embodiment, an uneven pattern may be formed on a surface 165 of the light-transmissive substrate 160, thereby further improving light extraction efficiency. Such an uneven pattern may be obtained by wet etching the surface of the light-transmissive substrate 160 or by dry etching the surface of the light transmissive substrate 160 using plasma.

The light-transmissive substrate 160 and the cell array CA may be bonded to each other by the eutectic bonding layer 190.

The eutectic bonding layer 190 may be formed using a eutectic bonding method, in which first and second bonding material layers deposited on the light-transmissive substrate 160 and the first surface S1 of the cell array CA, respectively, melt at a relatively low eutectic temperature, to be bonded to each other.

The first and second bonding material layers for the formation of the eutectic bonding layer 190 may include a material such as Bi58Sn42, which can be subjected to eutectic bonding at a relatively low temperature, for example, about 150° C. or less. As such, because the eutectic bonding layer 190 is formed at a relatively low temperature, the wavelength converting material (e.g., quantum dots), which is vulnerable to heat, may be mitigated or prevented from being damaged in the process of bonding the light-transmissive substrate 160 and the cell array CA.

The eutectic bonding layer 190 may include first to third light emitting windows 191, 192 and 193 in positions thereof corresponding to locations of the first to third light emitting devices LED1, LED2 and LED3. The first, second and third light emitting windows 191, 192 and 193 may space portions apart the cell array CA and the light-transmissive substrate 160 from each other. The space portions may be filled with air. Further, a material to reduce a refractive index difference between the cell array CA and the light-transmissive substrate 160 may be filled in the space portions.

The first, second and third light emitting windows 191, 192 and 193 may separate and transmit light rays emitted by the first, second and third light emitting devices LED1, LED2 and LED3, respectively, thereby mitigating or preventing light rays from interfering with each other. Thus, light emitted by the first and second light emitting devices LED1 and LED2 may be separately incident on the first and second wavelength conversion portions 166 and 167, respectively, and light emitted by the third light emitting device LED3 may be incident on the support portion 161 of the light-transmissive substrate 160. As described above, the eutectic bonding layer 190 may be in contact with the reflective layer 170, to mitigate or prevent a so-called light leakage phenomenon from occurring between the first, second, and third subpixels SP1, SP2 and SP3. According to an example embodiment, an area of the third light emitting window 193 may be smaller than an area of each of the first and second light emitting windows 191 and 192, such that a light amount of light emitted through the third light emitting window 193 is relatively low as compared with a light amount of light emitted through each of the first and second light emitting windows 191 and 192. The light emitted through the first and second light emitting windows 191 and 192 may be emitted through the first and second wavelength conversion portions 166 and 167, and the light emitted through the third light emitting window 193 may be emitted without passing through the wavelength conversion portion. In consideration of this, an amount of light emitted through the third light emitting window 193 may be relatively great. Thus, the area of the third light emitting window 193 may be smaller than the area of each of the first and second light emitting windows 191 and 192, such that the light amount of light emitted by the first, second and third light emitting windows 191, 192 and 193 may be uniformly adjusted.

In the case of the related art, in order to mitigate or prevent light emitted by subpixels of a display panel from interfering with each other, a partition structure having a light blocking effect is employed between the subpixels. As the display panel has a relatively high resolution, the size of pixels is gradually decreased. If a thickness of the partition structure is reduced accordingly, light rays emitted by subpixels may interfere with each other. Thus, there is a limitation in reducing the thickness of the partition structure in the conventional art. According to example embodiments, even though the size of the pixel (as well as subpixels included therein) is reduced, a thickness of a partition need not to be reduced. As a result, the display panel may have a high resolution, while reducing an amount of light emitted by each pixel. Thus, the amount of light emitted from the entirety of a display panel may be reduced compared with a display panel according to the conventional art.

According to an example embodiment of the present inventive concepts, the light emitting device package 10 replaces the partition structure, which has a light blocking effect and is employed in an existing light emitting device package with the support portion of the light-transmissive substrate. Thus, the size of the subpixel may not be limited as in the related art. Further, because the partition structure is removed, the light emitting device package 10 may be further miniaturized such that a distance between the subpixels is substantially reduced while substantially increasing the size of the subpixels. Further, because the light-transmissive substrate 160 may be used as a support supporting the cell array CA in a process of manufacturing the light emitting device package 10, the manufacturing process may be simplified.

Next, a process of manufacturing a light emitting device package will be described with reference to FIGS. 7 to 13. FIGS. 7 to 13 are schematic side cross-sectional views of main processes of manufacturing the light emitting device package of FIG. 5. Configurations of the same reference numerals as those of the light emitting device package 10 described above will be omitted to avoid duplication of description.

For example, a method of manufacturing the light emitting device package may be employ a method of manufacturing a chip scale package. Such a chip scale package may be implemented to have substantially the same package size as the semiconductor light emitting device. Thus, for example, when the chip scale package is used in a display panel, as a pixel size and a pixel pitch are reduced, a relatively high-resolution display panel may be manufactured. Further, all the processes are performed at a wafer level, and thus, may be suitable for mass production. Furthermore, an optical structure such as a wavelength conversion portion and an optical filter may be integrally manufactured together with a light emitting structure.

Figure 7:
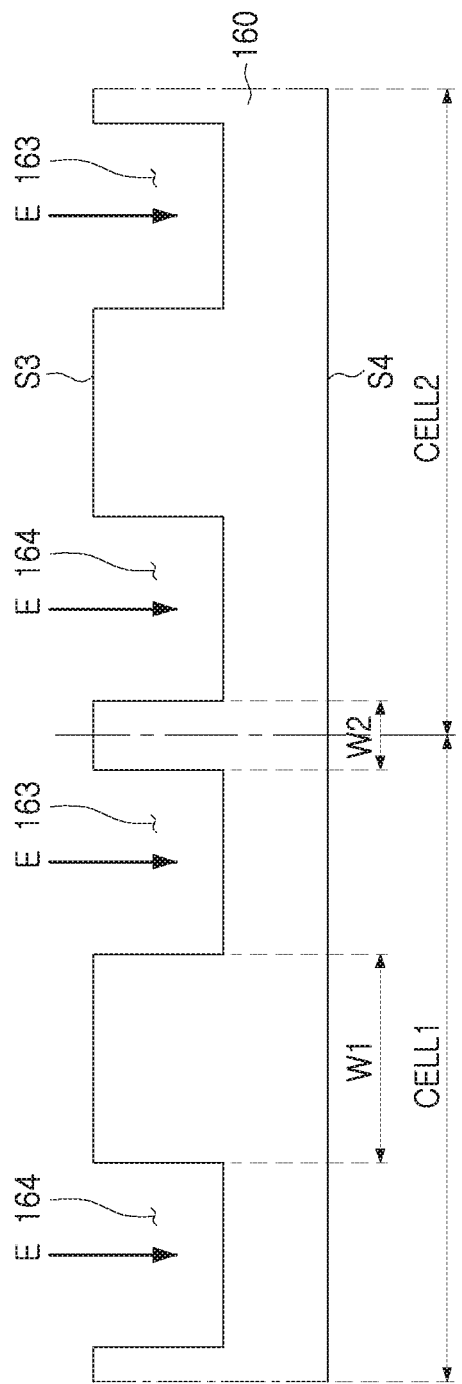
FIGS. 7 to 13 are schematic side cross-sectional views of example processes of manufacturing the light emitting device package of FIG. 5.

First, as illustrated in FIG. 7, first and second recesses 163 and 164 may be formed for each of pixel units CELL1 and CELL2, respectively, by etching (E) one surface S3 of a light-transmissive substrate 160. In some example embodiments, the first and second recesses 163 and 164 may be formed by dry etching the light-transmissive substrate 160 using, for example, oxide-deep reactive ion etching (O-DRIE). Further, various dry or wet etching methods used in the art may be used. The light-transmissive substrate 160 may have a wafer shape. As described above, the light-transmissive substrate 160 may include, for example, a light-transmitting insulating material, and may be formed of at least one of glass, quartz, a transparent resin, SiO2, SiNx, Al2O3, HfO, TiO2 or ZrO. An interval W1 between the first and second recesses 163 and 164 may be set to a size corresponding to a width of a third light emitting device LED3 of a cell array CA attached in a subsequent process. Further, an interval W2 between adjacent pixels may be set to a substantially reduced width within a range in which the light-transmissive substrate 160 is not broken in a dicing process. According to an example embodiment, an uneven pattern may be formed on the other surface S4 opposing the surface S3, at which the first and second recesses are formed, to improve light extraction efficiency.

Figure 8:
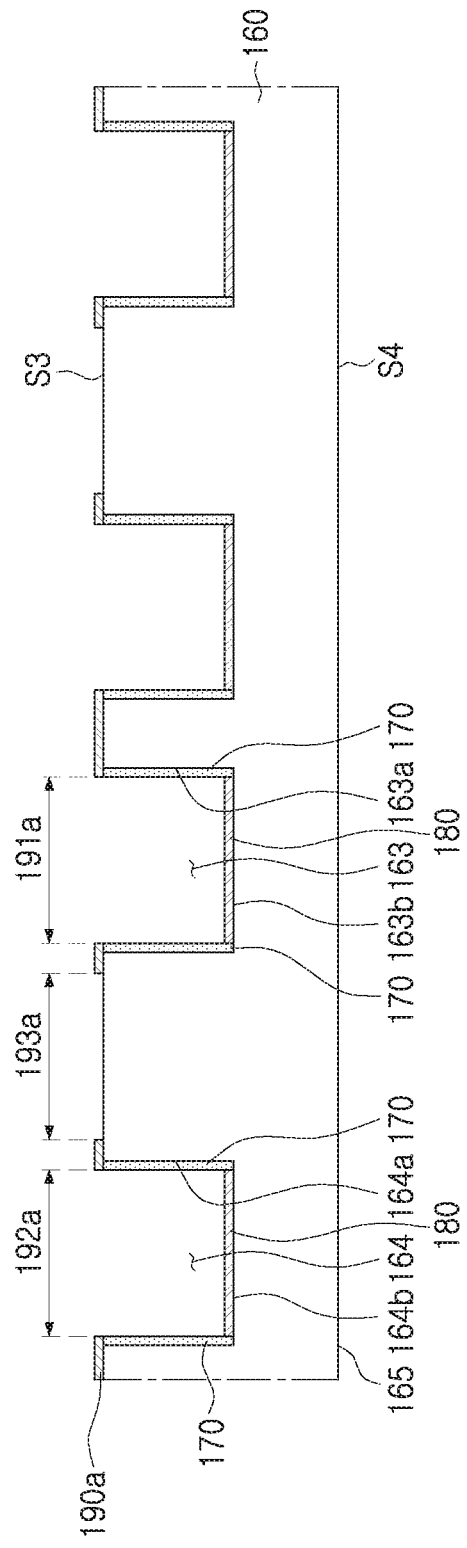

Subsequently, as illustrated in FIG. 8, a reflective layer 170 may be formed on side surfaces 163a and 164a of the first and second recesses 163 and 164. The reflective layer 170 may be formed by depositing a high reflective metal material including at least one of aluminum (Al), ruthenium (Ru), rhodium (Rh), gold (Au), silver (Ag), platinum (Pt), nickel (Ni), chromium (Cr), titanium (Ti), or copper (Cu).

An optical filter layer 180 may be disposed on lower surfaces 163b and 164b of the first and second recesses 163 and 164.

A first bonding material layer 190a for formation of a eutectic bonding layer may be deposited on one surface S3 of the light-transmissive substrate 160, and first to third through-holes 191a, 192a and 193a may be formed. As a material of the first bonding material layer 190a, a material capable of being subjected to eutectic bonding at a relatively low temperature, for example, about 150° C. or less, such as Bi58Sn42, may be used. The first bonding material layer 190a may be formed to be in contact with the reflective layer 170.

Figure 9:
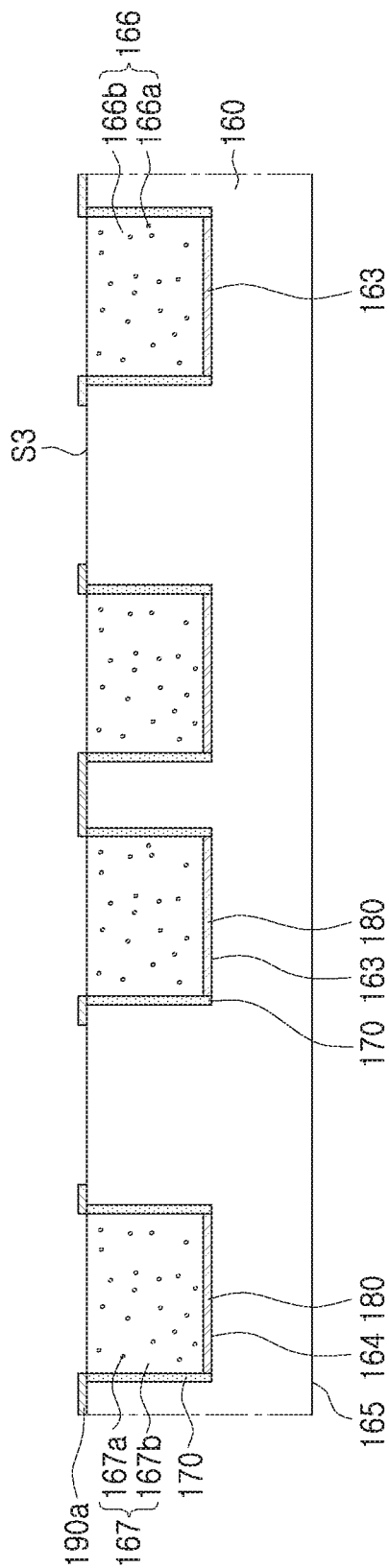

Then, as illustrated in FIG. 9, a first wavelength conversion portion 166 may be formed by, for example, inkjet printing a light-transmissive liquid resin 166b mixed with red phosphors 166a in the first recess 163, and a second wavelength conversion portion 167 may be formed by, for example, inkjet printing a light transmissive liquid resin 167b mixed with green phosphors 167a may in the second recess 164.

Figure 10:
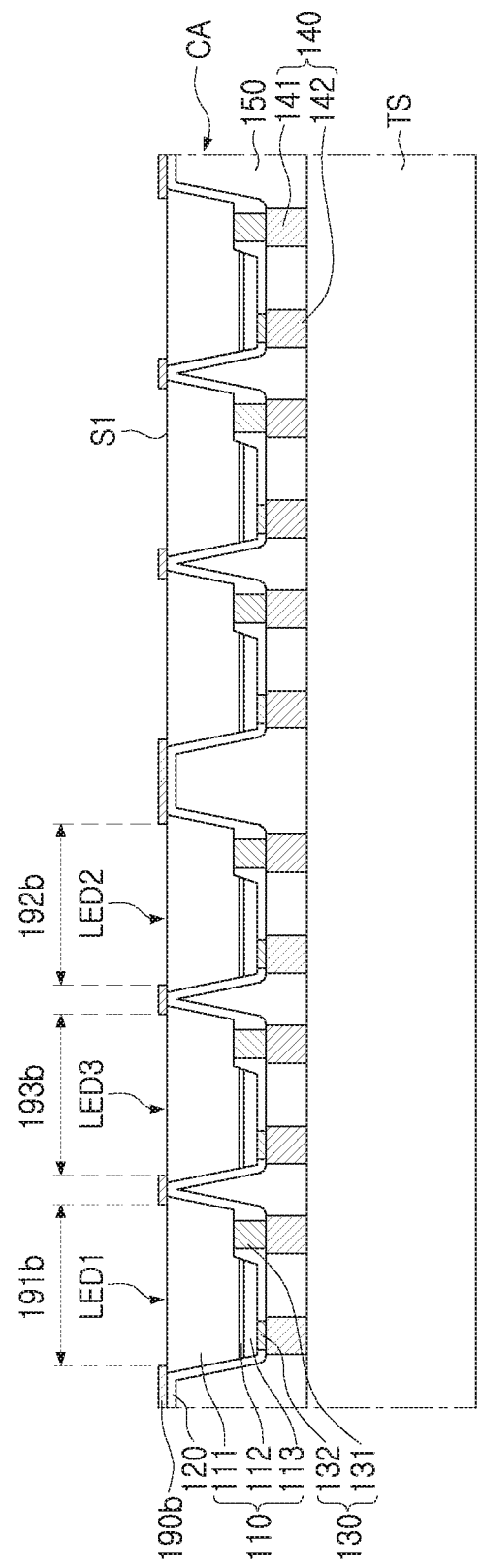

Then, as illustrated in FIG. 10, a light emitting structure 110 including a first conductivity-type semiconductor layer 111, an active layer 112 and a second conductivity-type semiconductor layer 113, and a cell array CA including an insulating layer 120 surrounding the light emitting structure 110, an electrode portion 130, an electrode pad part 140 and a molding part 150 may be prepared in a state in which a temporary substrate TS is attached thereto.

A second bonding material layer 190b for formation of a eutectic bonding layer may be deposited on a first surface S1 of the cell array CA, and fourth to sixth through-holes 191b, 192b and 193b may be formed. The fourth to sixth through-holes 191b, 192b and 193b may be formed to have the same sizes as the first to third-through holes 191a, 192a and 193a of the first bonding material layer 190a deposited on one surface S3 of the light-transmissive substrate 160, respectively. As a material of the second bonding material layer 190b, a material such as Bi58Sn42 may be used in the same manner as the first bonding material layer 190a, but example embodiments are not limited thereto. In some example embodiments, any material capable of being subjected to eutectic bonding to the first bonding material layer 190a at a relatively low temperature, for example about 150° C. or less may be used.

Figure 11:
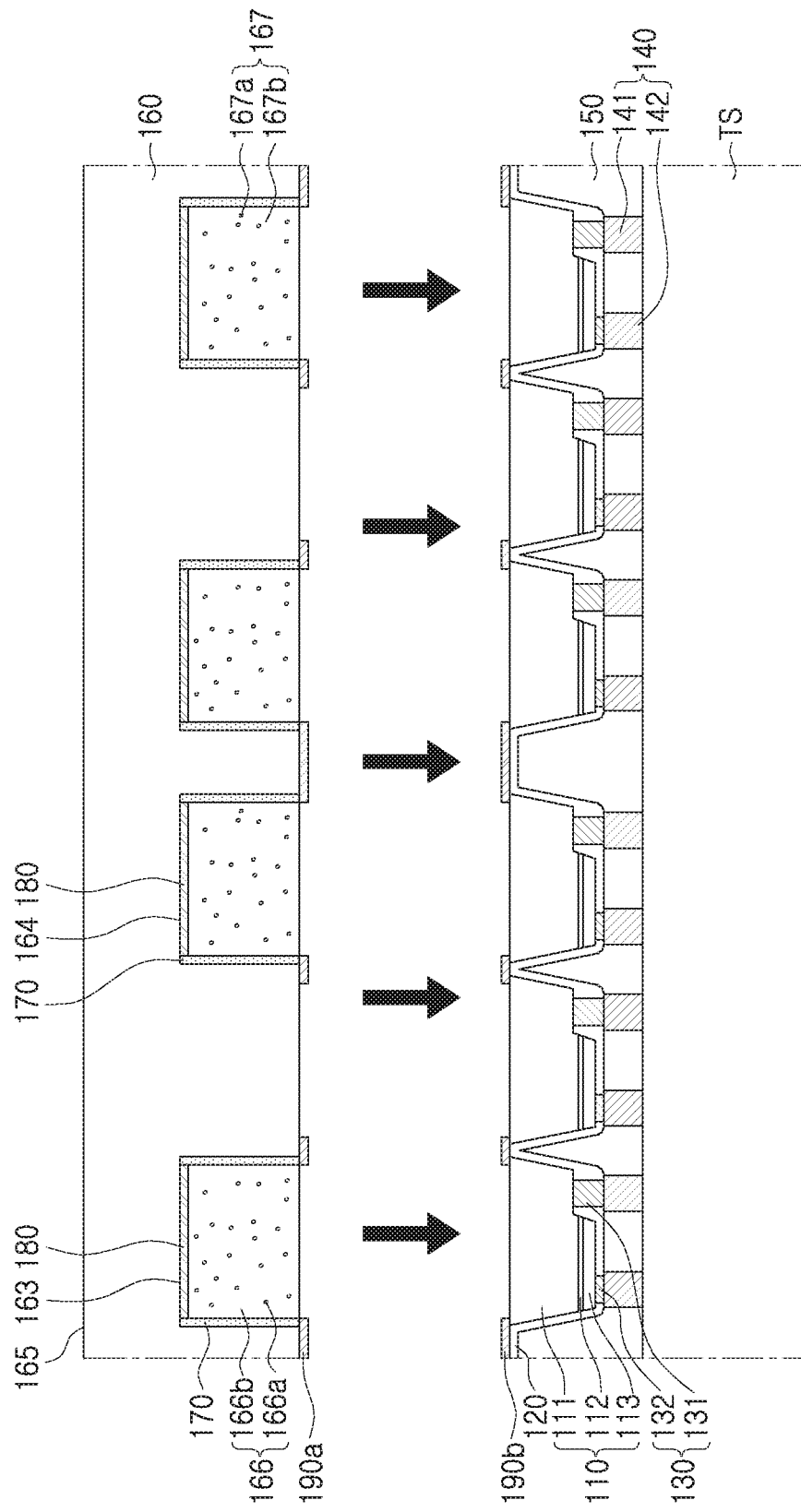

Next, as illustrated in FIG. 11, the first bonding material layer 190a of the light-transmissive substrate 160 and the second bonding material layer 190b of the cell array CA may be in contact with each other, and may be heated at a eutectic temperature or higher to be eutectic bonded to each other.

Figure 12:
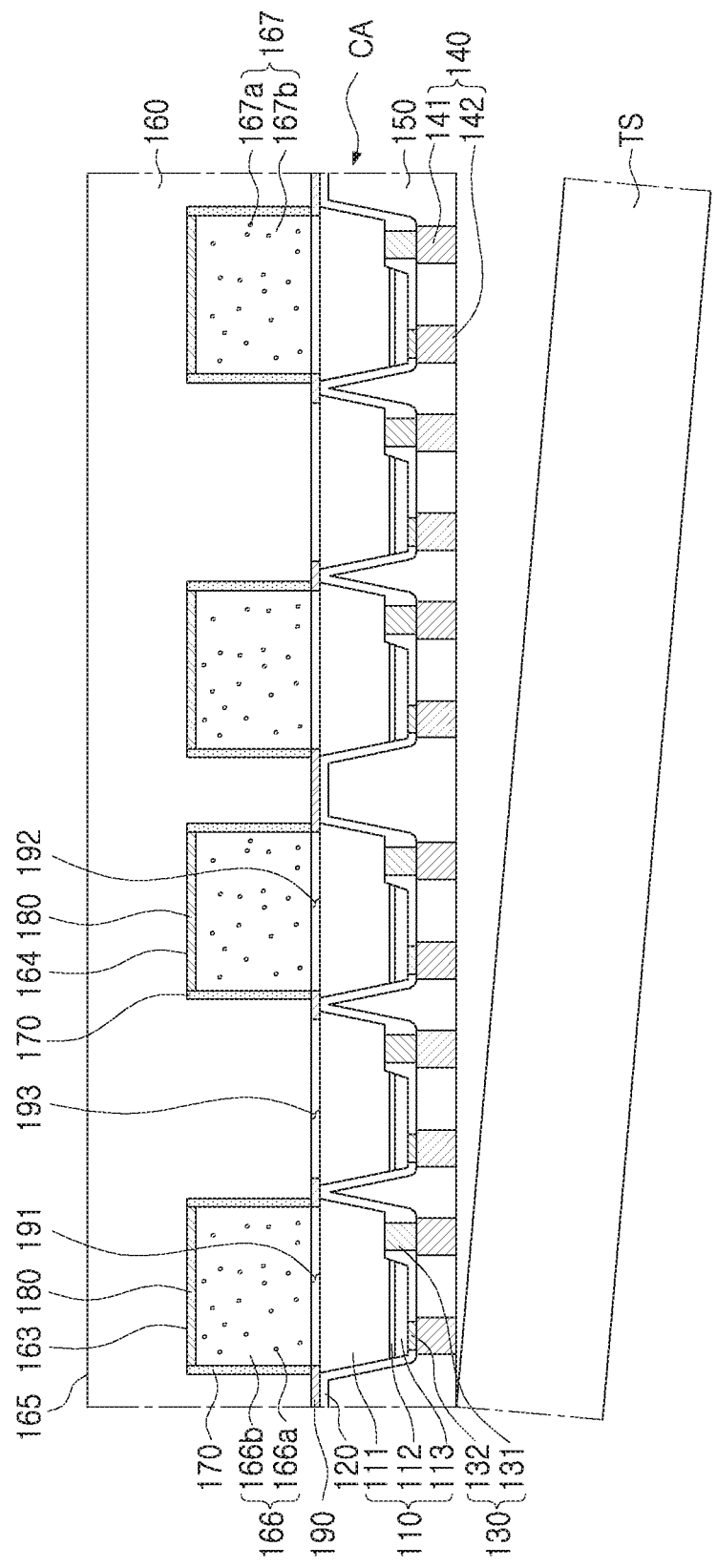

Then, as illustrated in FIG. 12, the temporary substrate TS may be separated from the cell array CA by using the light-transmissive substrate 160 as a support.

Figure 13:
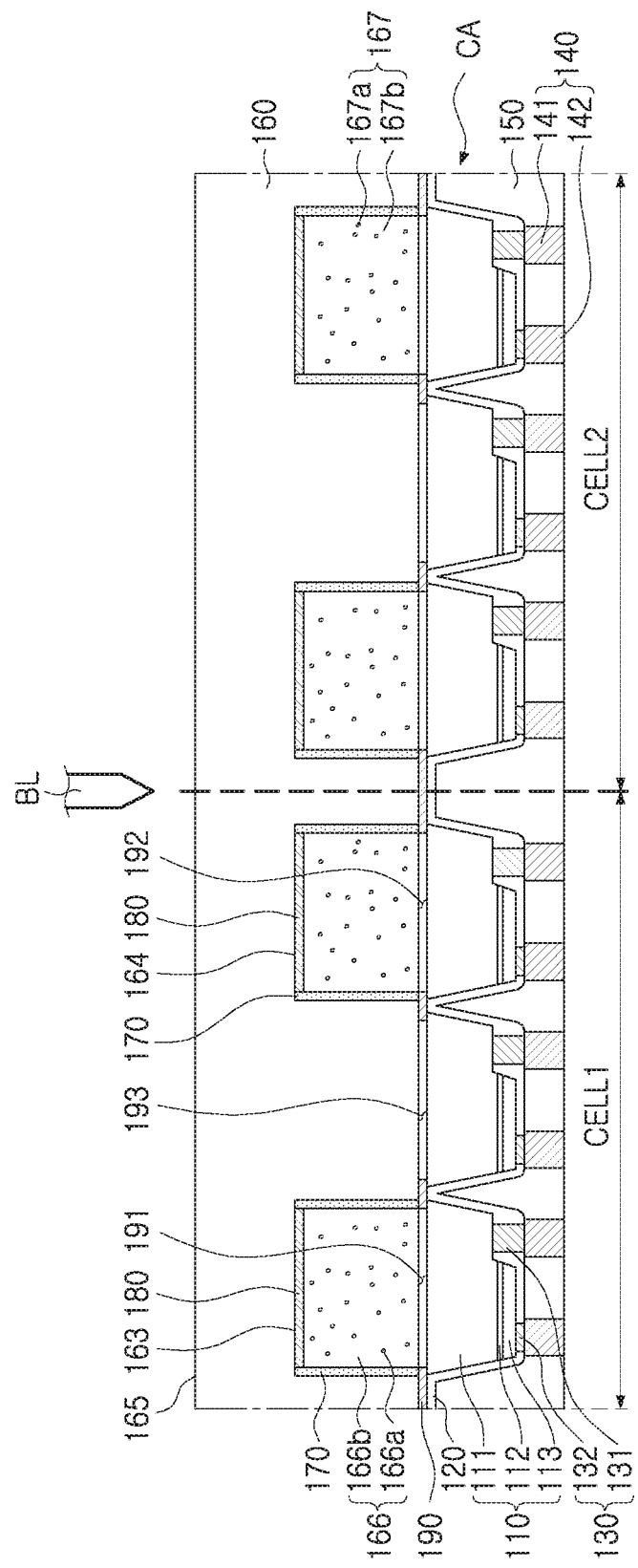

Next, as illustrated in FIG. 13, a process of cutting the light-transmissive substrate 160 and the cell array CA into pixel units CELL1 and CELL2 may be performed by using a blade BL, thereby manufacturing the light emitting device package 10 illustrated in FIG. 5. The process of cutting into pixel units CELL1 and CELL2 according to example embodiments are not limited thereto. In some example embodiments, a process of process of cutting into pixel units CELL1 and CELL2 may be performed by using a laser or a water jet.

As set forth above, in the case of light emitting device packages according to example embodiments and display devices using the same, a manufacturing time thereof may be reduced, and the miniaturization thereof may become relatively easy.

While some example embodiments have been shown and described above, it will be apparent to those skilled in the art that modifications and variations could be made without departing from the scope of the present inventive concepts as defined by the appended claims.

What is claimed is:
1. A light emitting device package comprising:
a cell array including a first light emitting device, a second light emitting device, and a third light emitting device, each of the first, second and third light emitting devices including a first conductivity-type semiconductor layer, an active layer, and a second conductivity-type semiconductor layer, the cell array having a first surface and a second surface opposing the first surface;
a light-transmissive substrate including a first wavelength conversion portion and a second wavelength conversion portion corresponding to the first light emitting device and the second light emitting device, respectively, the light-transmissive substrate bonded to the first surface; and
a eutectic bonding layer including a first light emitting window, a second light emitting window, and a third light emitting window corresponding to the first light emitting device, the second light emitting device, and the third light emitting device, respectively, the eutectic bonding layer bonding the light-transmissive substrate and the first to third light emitting devices to each other, wherein the light-transmissive substrate comprises first and second recesses corresponding to the first and second light emitting devices, respectively, at a surface in contact with the first surface, and the first and second wavelength conversion portions are in the first and second recesses, respectively, and are configured to provide light rays having wavelengths different from wavelengths of light rays emitted by the first and second light emitting devices, respectively.

2. The light emitting device package of claim 1, wherein the light-transmissive substrate comprises one of soft glass, fused silica, and fused quartz.

3. The light emitting device package of claim 1, wherein the light-transmissive substrate comprises a support portion between the first and second recesses, and the support portion is attached to the cell array by the eutectic bonding layer.

4. The light emitting device package of claim 1, wherein each of the first and second recesses are provided with a reflective layer on a side surface thereof.

5. The light emitting device package of claim 4, wherein the reflective layer is in contact with the eutectic bonding layer.

6. The light emitting device package of claim 1, wherein the first, second and third light emitting devices are configured to emit blue light.

7. The light emitting device package of claim 6, wherein the first and second wavelength conversion portions overlap the first and second light emitting devices, respectively, and the first and second wavelength conversion portions comprise a red phosphor and a green phosphor, respectively.

8. The light emitting device package of claim 1, wherein the first, second and third light emitting devices are in parallel with each other, and the third light emitting device is between the first and second light emitting devices.

9. The light emitting device package of claim 1, further comprising:
at least one of an optical filter layer and a distributed Bragg reflector (DBR) on upper surfaces of the first and second wavelength conversion portions.

10. The light emitting device package of claim 1, wherein the first, second and third light emitting windows provide a space portion therebetween by which the cell array and the light-transmissive substrate are spaced apart from each other.

11. The light emitting device package of claim 10, wherein the space portion is filled with air.

12. The light emitting device package of claim 1, wherein an area of the third light emitting window is smaller than an area of each of the first and second light emitting windows.

13. The light emitting device package of claim 1, wherein the eutectic bonding layer includes $Bi_{58}Sn_{42}$.

14. A light emitting device package comprising:
a light-transmissive substrate including a first region and a second region, the first region including at least one wavelength conversion portion;
a cell array bonded to the light-transmissive substrate, the cell array including a first light emitting device, a second light emitting device and a third light emitting device, each of the first to third light emitting devices including a first conductivity-type semiconductor layer, an active layer, and a second conductivity-type semiconductor layer, the first light emitting device and the second light emitting device overlapping the first region, the third light emitting device overlapping the second region; and a eutectic bonding layer including a plurality of light emitting windows corresponding to the first light emitting device, the second light emitting device, and the third light emitting device, respectively, the eutectic bonding layer bonding the light-transmissive substrate and the cell array to each other, wherein the light-transmissive substrate comprises first and second recesses corresponding to the first and second tight emitting devices, respectively, on a surface facing the cell array, and each of the first and second recesses are provided with a reflective layer on a side surface of thereof.

15. The light emitting device package of claim 14, wherein the light-transmissive substrate comprises one of soft glass, fused silica and fused quartz.

16. The light emitting device package of claim 14, wherein the wavelength conversion portion comprises a phosphor or a quantum dot.

17. The light emitting device package of claim 16, wherein
the at least one wavelength conversion portion comprises a first wavelength conversion portion and a second wavelength conversion portion, the first and second wavelength conversion portions overlapping the first and second light emitting devices, respectively, and
the first and second wavelength conversion portions are configured to convert light rays emitted by the first and second light emitting devices into light rays having different wavelengths, respectively.

18. A display device comprising:
a display panel including a circuit board and a plurality of light emitting device packages arranged in rows and columns on the circuit board, each of the plurality of light emitting device packages providing a single pixel;
a driver configured to drive the display panel; and
a controller configured to control the driver,
wherein the display panel includes,
a cell array including a first light emitting device, a second light emitting device, and a third light emitting device, each of first, second and third light emitting devices including a first conductivity-type semiconductor layer, an active layer and a second conductivity-type semiconductor layer, the cell array having a first surface and a second surface opposing the first surface,
a light-transmissive substrate including a first wavelength conversion portion and a second wavelength conversion portion corresponding to the first light emitting device and the second light emitting device, respectively, the light-transmissive substrate bonded to the first surface, and
a eutectic bonding layer including a first light emitting window, a second light emitting window, and a third light emitting window corresponding to the first light emitting device, the second light emitting device and the third light emitting device, respectively, the eutectic bolding layer bonding the light-transmissive substrate and the first to third light emitting devices to each other, wherein
the light-transmissive substrate comprises first and second recesses corresponding to the first and second light emitting devices, respectively, at a surface in contact with the first surface, and
the first and second wavelength conversion portions are in the first and second recesses, respectively, and are configured to provide light rays having wavelengths different from wavelengths of light rays emitted by the first and second light emitting devices, respectively.

\* \* \* \* \*